(12) United States Patent
Clark et al.

(10) Patent No.: US 7,794,800 B2
(45) Date of Patent: Sep. 14, 2010

(54) COMPONENT COATING

(75) Inventors: Daniel Clark, Derby (GB); Jeffrey Allen, Derby (GB)

(73) Assignee: Rolls-Royce plc, London (GB)

( * ) Notice: Subject to any disclaimer, the term of this patent is extended or adjusted under 35 U.S.C. 154(b) by 1250 days.

(21) Appl. No.: 11/216,122

(22) Filed: Sep. 1, 2005

(65) Prior Publication Data

US 2006/0060467 A1 Mar. 23, 2006

(30) Foreign Application Priority Data

Sep. 18, 2004 (GB) ................................. 0420751.0

(51) Int. Cl.
| | |
|---|---|
| B05D 3/06 | (2006.01) |
| B05D 3/00 | (2006.01) |
| B05D 7/14 | (2006.01) |
| B05D 5/00 | (2006.01) |
| C23C 14/16 | (2006.01) |
| C23C 14/34 | (2006.01) |
| C23C 14/58 | (2006.01) |
| B05D 1/12 | (2006.01) |

(52) U.S. Cl. ........................ 427/554; 427/556; 427/559; 427/597; 427/405; 427/191; 204/192.15; 204/192.16

(58) Field of Classification Search ........................ None
See application file for complete search history.

(56) References Cited

U.S. PATENT DOCUMENTS

| | | | |
|---|---|---|---|
| 3,951,642 A | 4/1976 | Chang | |
| 4,627,896 A | 12/1986 | Nazmy | |
| 4,818,562 A * | 4/1989 | Arcella et al. | 427/597 |
| 4,854,196 A | 8/1989 | Mehan | |
| 5,238,492 A * | 8/1993 | Itoh et al. | 106/436 |
| 5,425,822 A * | 6/1995 | Hidaka et al. | 148/407 |
| 5,846,600 A * | 12/1998 | Yamada et al. | 427/213 |
| 5,902,498 A * | 5/1999 | Mistry et al. | 219/121.64 |
| 6,024,915 A * | 2/2000 | Kume et al. | 419/48 |
| 6,122,564 A * | 9/2000 | Koch et al. | 700/123 |
| 6,350,326 B1 * | 2/2002 | McCay et al. | 148/503 |
| 6,524,381 B1 * | 2/2003 | Phillips et al. | 106/417 |
| 2002/0168466 A1 * | 11/2002 | Tapphorn et al. | 427/180 |

FOREIGN PATENT DOCUMENTS

| | | | |
|---|---|---|---|
| EP | 0 345 795 A | | 12/1989 |
| GB | 2 182 349 A | | 5/1987 |
| JP | 03-87322 A | * | 4/1991 |
| WO | WO 2004/020139 A1 | * | 3/2004 |

* cited by examiner

*Primary Examiner*—Marianne L Padgett
(74) *Attorney, Agent, or Firm*—Jeffrey S. Melcher; Manelli Denison & Selter PLLC

(57) ABSTRACT

In order to achieve micro alloying of protective coatings for components such as turbine blades in a turbine engine, a base metal is splutter coated by deposition of a trace element to a desired proportion. A protective layer of the base metal is then applied over the trace element to prevent further reaction or oxidation of the trace elements. A coating consumable is therefore formed from the base metal and the trace element. The consumable may be produced immediately prior to coating of the component or may be inertly stored for subsequent use. The consumable is applied by laser deposition techniques whereby a coating is formed in the melting process.

8 Claims, 2 Drawing Sheets

COMPONENT COATING

FIELD OF THE INVENTION

The present invention relates to component coating and more particularly to coating components with alloys having a low trace element content with that trace element being relatively reactive or subject to oxidation.

BACKGROUND OF THE INVENTION

Clearly, components must be formed in order that they provide the necessary structural or operational performance in the environment dictated by the machine or structure within which those components are utilised. In gas turbine engines certain components will operate at relatively high temperatures and sometimes in excess of the melting point of the metal from which those components are formed. This is achieved through appropriate cooling of the component but also by applying relatively high performance coatings to those components in order to achieve resistance to surface pitting at the elevated temperatures.

Turbine blades must operate at temperatures in excess of the melting point of the material from which the blade is formed. Typically, a protective coating is provided particularly at the tips of those blades where the blade is thin and subject to aerodynamic friction. One coating that is applied comprises a nickel alloy in which one of the trace elements is hafnium. Previously, this alloy was coated upon the turbine blade component by initially creating a master alloy block in a crucible. This leads to inconsistent and unpredictable losses of trace elements due to reaction with crucible walls. The nickel is heated in the crucible until it is molten and then the hafnium is added with appropriate stirring, etc in order to achieve or approach the desired distribution for the hafnium within the master alloy block. It will be appreciated that once melted and the hafnium mixed into the nickel the block is allowed to cool under controlled conditions, but despite best efforts it is not possible to obtain a good distribution of hafnium throughout the master alloy and there is generally a directional aspect to the cooling with cooling being more quickly achieved towards the crucible walls in comparison with the centre of the molten mass in the crucible. These problems are a result of trace element concentration loss of due to reaction crucible walls. These reactions are not usually predictable. In any event, hafnium reacts with the ceramic walls of the crucible, which creates problems including slag within the alloy block. Hafnium also scavenges oxygen from the chamber walls and oxidises and this again can create occlusions and slag within the master alloy block. As indicated, this approach is not ideal in that the hafnium is poorly distributed through the master alloy and that alloy may include undesirable elements. Additionally, formation of the master alloy block is a relatively massive procedure whereby a large block is formed from which only a small amount may be required at any particular time.

The increased desire to achieve higher engine efficiencies leads to turbine engines operating at higher temperatures and so a greater necessity to provide reliable and more convenient application of protective coatings such as those described above with respect to Nickel-Hafnium alloys upon turbine blade components.

SUMMARY OF THE INVENTION

In accordance with the present invention there is provided a method of coating a component comprising:

a) presenting a base metal to means for ion sputter dispersal of a trace element;

b) sputtering a desired proportion of the trace element upon the base metal;

c) applying a protective layer over the trace element to form a coated consumable; and d) presenting the coated consumable to a component whereby application of a laser beam causes the coated consumable to melt in order to apply a coating to the component.

The protective layer is applied to prevent reaction or oxidation degradation of the trace element. The protective layer may be the same as the base metal. Generally, the base metal is in particulate form.

Typically, the base metal is the same as the major constituent of the component. Alternatively the base metal has the same composition as the component.

Generally, the coating consumable is presented to the component through a sputter deposition.

Possibly, the base metal is nickel. Possibly, the trace element is hafnium.

Typically, presentation of the base metal in particulate form is in the form of a fluid bed for even distribution of the trace element on the particulate base metal.

Generally, the component is a blade for a turbine engine.

Additionally, in accordance with the present invention there is provided a consumable for coating or forming a component comprising a base metal upon which a trace element is sputtered and a protective layer is applied over the trace element. The trace element is susceptible to oxidation when molten. The application of a protective layer over the trace elements gives a coating consumable which is relatively stable upon the base metal whilst allowing alloying of that trace element with the base metal and/or with a substrate metal of a component.

Possibly, the consumable is a particulate form, advantageously with a major dimension in the order of less than 2 microns. Alternatively, the base metal is in a continuous solid form, such as wire or rod, to allow use of a deposition technique to form a component.

Additionally, in accordance with the present invention there is provided a component formed from a consumable as defined above.

Further in accordance with the present invention there is provided a method of forming a consumable for coating or form a component, the method comprising a) presenting a base metal to means for sputter application of a trace element; and b) sputtering a desired proportion of a trace element upon the base metal, c) applying a protective layer over the trace element to form the consumable.

The application of the protective layer prevents reaction or oxidation of the trace element.

Possibly, there is fluidisation of the base metal particulate in a powder bed by mechanical vibration to facilitate application of trace element evenly throughout the particulate.

Possibly, the base metal is in the form of a wire or rod to allow use of a deposition technique to form a component.

Possibly, the particulate base metal is electrically charged in order to attract the trace metal.

BRIEF DESCRIPTION OF THE DRAWINGS

Embodiments of the present invention will now be described by way of example and with reference to the accompanying drawings in which.

DETAILED DESCRIPTION OF THE INVENTION

Figure 1:
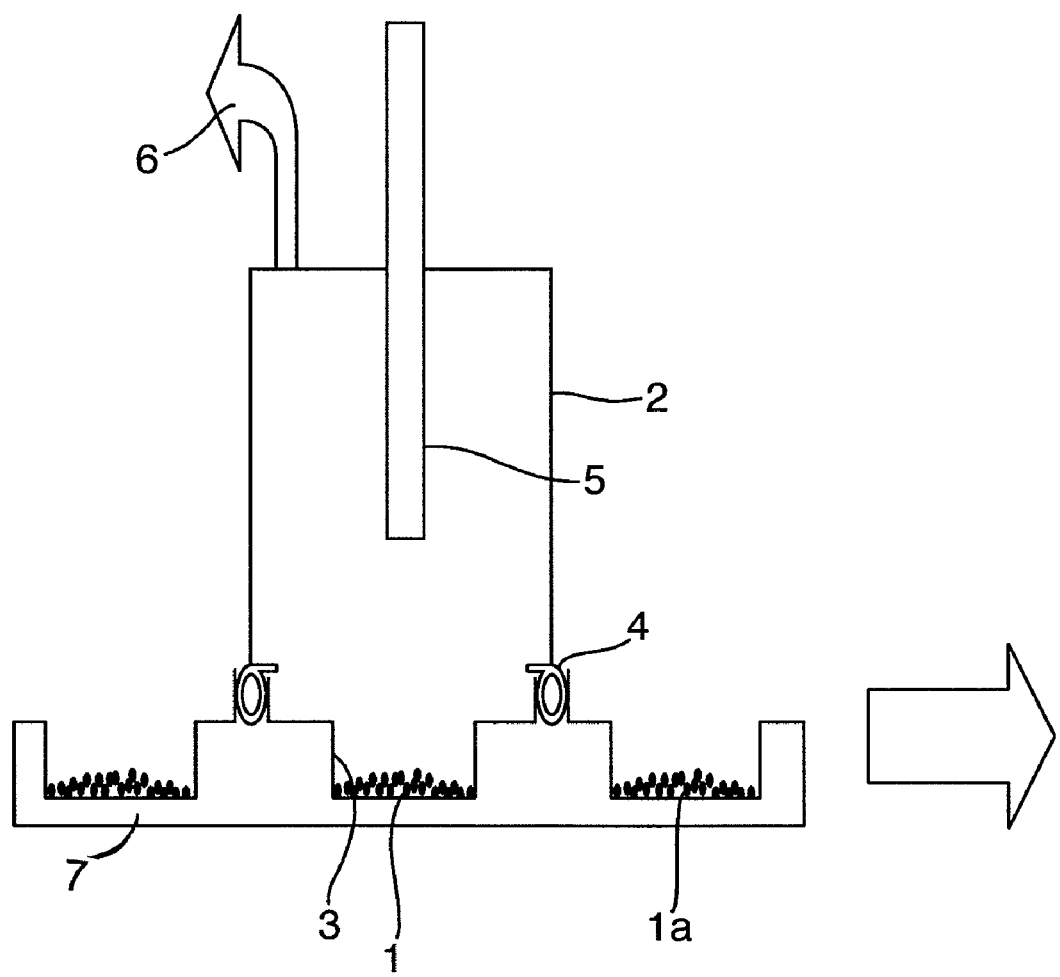
FIG. 1 is a schematic illustration illustrating one approach to creating a coating consumable in accordance with one embodiment of the present invention.

Techniques for weld deposition and additive manufacturing by use of direct laser deposition are relatively well known. Essentially a donor powder or wire is presented to a surface in order that through a laser beam directed towards the powder there is molten deposition and build up of a surface. Nevertheless, traditionally micro alloying for aerospace alloys in order to provide coating protection is generally performed during a casting stage whereby there is addition of a master alloy composition.

Unfortunately trace elements, such as hafnium, can be problematic in terms of uncertain yield as these elements tend to be included as mere trace additions which can be lost within the melt either by reaction, substitution with crucible walls or by absorption/adsorption upon filtration surfaces. The mechanisms thought to apply are based upon oxidation reactions with metal in the molten state in prolonged contact with ceramic surfaces where the metallic ion component of the ceramic is thermo-dynamically less stable in the ceramic state than the micro alloy additional trace additive element. This mechanism can also apply where the alloying additional trace element forms a ceramic particle but these particulates are filtered out by high surface area, ceramic (surface tension based filters). Finally, when added to a casting chemistry prior to atomisation, there is a limitation of the homogeniality that can be achieved by electromagnetic mixing. Thus, distribution of the trace metal within the master alloy will be compromised.

As indicated above, particular problems are experienced with respect to applying coatings for blade tips used in turbine engines. Blade tipping is used to give wear and oxidation resistance coatings to the tips of turbine blades. The coating is of a different material at the tip in order to render blade tips as having resistance to higher temperatures and tip abrasion. The more consistent and homogenous the coating provided upon the blade tip generally the more effective protection provided. Turbine blades are exposed to extremely high operating temperatures. These high operating temperatures are mitigated by cooling air, but the amount of cooling air used in this way is limited and affects engine efficiency. Greater engine efficiency is gained by achieving high material operating temperatures. The practical limit to blade operating temperatures is the oxidation resistance of the material from which the blades are formed. As blades are oxidised at their tips, material is lost locally causing the geometry of the tip to change. Any change in blade geometry has two problems. Firstly there is a pressure loss which impairs engine performance and secondly the changed airflow tends to accelerate the rate of chemical erosion of the blades.

It is known to counter the oxidation breakdown by applying a coating to provide protection at higher temperatures. This coating generally comprises provision of additive quantities of alloys of similar composition to the blade but containing trace elements such as hafnium, yttrium and lanthanum. These elements tend to stabilise the higher temperature protective oxide layer as a passive barrier to oxidation of the underlying base metal alloy of the blade.

The quantity of these trace elements required is extremely small. The trace elements referred to in the present invention may be any of the elements in Group III or Group IV of the Periodic Table or the group of elements known as Lanthanides. Generally, the trace element will be present in the range of 30 to 80 parts per million to be effective. Below 30 parts per million trace elements there is insufficient quantity of alloy addition to be effective in terms of distribution within the melt. However, above 80 parts a million the parent base metal alloy becomes prone to localised melting where a lower melting point alloy can form within the blade's tip region. Localised melting acts as a limit on the temperature capability of the blades. Limitations with respect to current alloying techniques creates uncertain yields as a result of process variability when making an addition to the block melt for blade tipping alloys based upon nickel or cobalt alloyed with chromium, aluminium and a trace element such as hafnium, yttrium and lanthanum. There tends to be unpredictability in yield due to the effect of these trace elements scavenging oxygen ions from the crucible walls and otherwise interacting with the ceramic liner of crucibles. Oxides formed in this way can be detrimental to downstream processing. Alloying yield variability is related to the variation in residence time and crucible wall variations. In such circumstances, people forming these alloys tend to over alloy, that is to say incorporate relative excessive proportions of trace elements. However, this process is unpredictable and causes wide variation in the concentration of the trace element in the alloy. Once the alloys have been formed it is generally converted to particulate form and then utilised in a direct laser deposition process in order to apply the coating to the component.

The present invention retains use of direct laser deposition or a similar technique in order to apply the coating to the component, but the powder is formed by a distinct process. Essentially, the trace element is not added to the base metal alloy during a melt phase within a crucible, but rather that base metal alloy is initially formed as a particulate powder and the trace elements ion sputtered upon that base metal alloy in an appropriate environment. That environment generally comprises a vacuum or inert gas with the sputter electrode for the trace element appropriately cool in order to inhibit oxidation of the trace element thereat. In such circumstances, the particulate base metal alloy acts as a carrier for the trace element such that the uncertainties of alloy melting and casting are avoided. As the proportion of trace element required is so low, ion sputter deposition upon alloy particulates allows close control of the proportion of trace element spluttered upon the base alloy particulate.

Furthermore a protective layer or coating is provided over the trace element that has been sputtered upon the base alloy. The protective coating prevents reaction or oxidation of the trace element and increases the effective life of the particulate.

The protective coating applied will generally be the same as the base alloy of the underlying particulate. Thus upon deposition on the component the protective layer will become mixed with the base particulate forming the micro alloying necessary to create the protective coating to the component.

It will be appreciated that in providing a protective coating of the base material that the actual base particulate upon which the trace element is ion sputter deposited may be reduced so that the overall size of the coating particulate does not change and more importantly the chemical composition of that coating particulate remains as required for micro alloying.

In a particular embodiment of the present invention the coating takes the form of a partial line of sight coating through ion plating or sputter of the trace element on the base alloy particulate. The base alloy particulate as indicated is a consumable in the deposition process utilised. In such circumstances, normally the particulate is presented as a powder, although the powder may be compressed into a wire for presentation to a component such as a blade tip. When a powder is used then the powder is channelled in a discrete trough or groove in a disc for presentation at an even rate with an inert carrier gas. The powder stream is divided into the melt pool upon the component such that the application of a laser heats the substrate allowing the incident powder to fuse by melting or sintering to the component surface to establish deposition and application of the coating layer.

Direct laser deposition generally occurs within an inert gas shield or within a vacuum, but in either event some form of feed for the consumable powder or wire is required. In such circumstances a labyrinth or other seal is necessary through which the consumable plating particulate is presented.

It will be understood that the sputter of the trace element could follow the deposition of a previous base alloy layer. In such circumstances, micro alloying of the trace element will occur through fusing in with subsequent deposition passes of the deposition process.

The present invention allows for more consistent processing to higher target concentration accuracy for the micro-alloying constituents, that is to say the trace elements. In such circumstances, a higher minimum concentration level, closer to the optimum micro alloy chemistry levels can be achieved. In such circumstances the coating applied to components such as blades at their tip can be optimised for less oxidation of that blade tip and therefore longer life.

FIG. 1, schematically illustrates the application of the trace element to a base alloy particulate mass 1. The base alloy particulate mass 1 is formed by a volume of particulate or powder base alloy grains in the order of a few microns in diameter. In order to facilitate ion deposition, a vacuum chamber 2 is formed about a boat or vessel 3 holding the mass of base metal 1. A vacuum seal 4 is provided across the vessel 3 with an ion source 5 presented to sputter an appropriate composition of trace elements upon the particulates of the mass 1. The powder bed can be fluidised by mechanical vibration to ensure that all the particles are coated evenly with trace elements or metal. The chamber 2 is evacuated by extraction in the direction of arrowhead 6 or has an inert environment to avoid oxidation of the ion deposition or other reactions in the transient before deposition. Furthermore, the ion source 5 is cooled to prevent or at least inhibit such reaction or ionisation of the source 5.

As the mass 1 is typically relatively cool, its reactivity is reduced and therefore once an appropriate composition proportion has been deposited from the ion source 5 upon the mass 1, a protective layer of the base metal is applied before presentation to the component for laser deposition in accordance with accepted procedure. In such circumstances, a conveyor 7 can be provided whereby batches of particulates 1a are processed ready for subsequent coating upon components.

Figure 2:
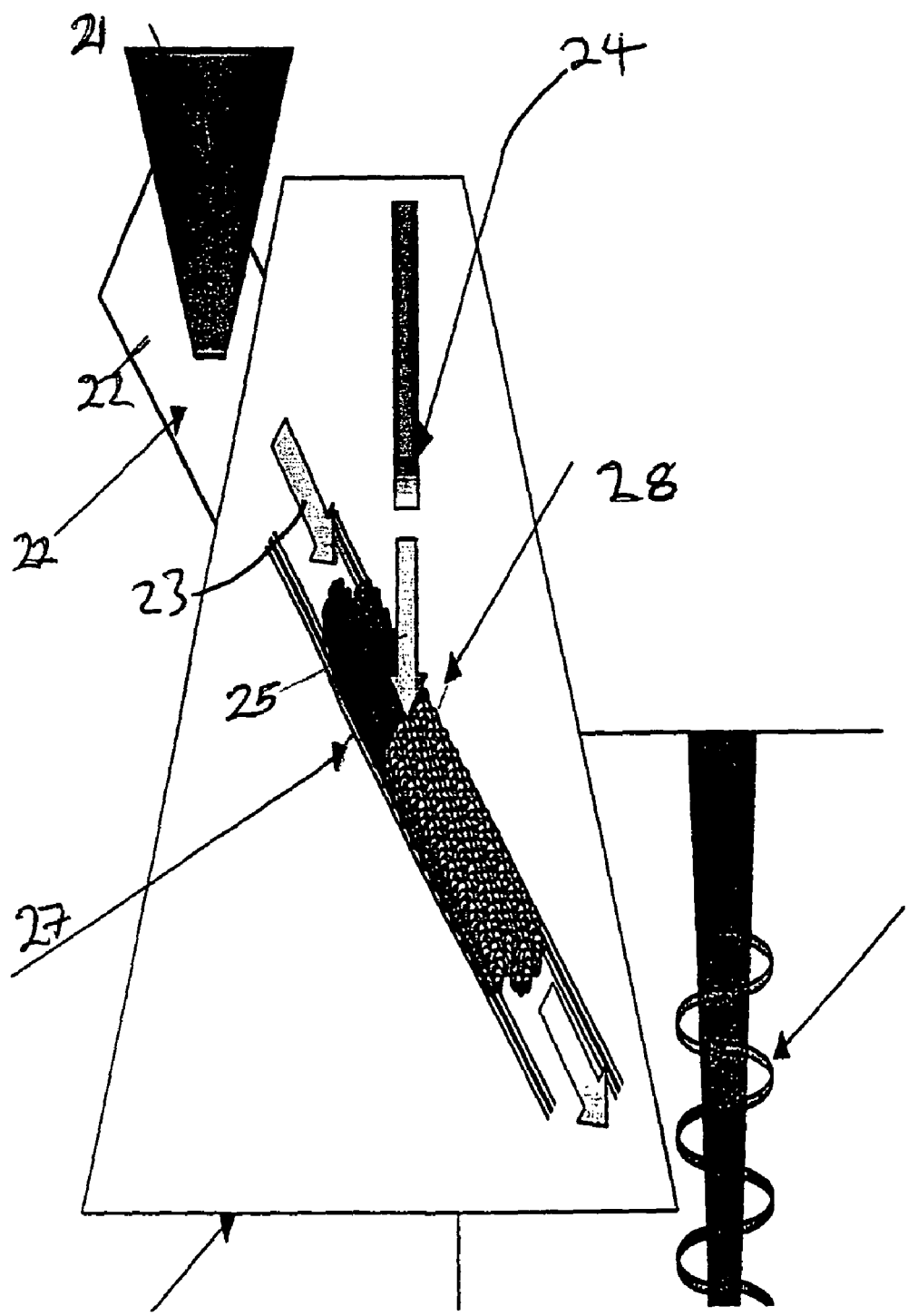
FIG. 2 is a schematic illustration depicting formation of a coating consumable in accordance with the present invention as well as means for coating deposition in accordance with a second embodiment of the present invention.

FIG. 2 illustrates an alternative approach to providing a deposition powder for micro alloying and coating upon a component. Thus, a hopper 21 is utilised to store base alloy powder typically under a dry nitrogen or vacuum atmosphere. Powder falls from the hopper 21 upon a conveyor 22 either continuously or in batch increments such that the powder flows in the direction of arrowhead 23 to become exposed to an ion source 24. The conveyor 22 acts to corral and channel the powder base alloy such that it receives sputter deposition of trace element in the direction of arrowhead 25. Thus, prior to sputter deposition, the powder comprises simply the base alloy consumable utilisable for direct laser deposition whilst after sputter deposition of the trace element that powder 28 has a short life before oxidation reaction of the trace element. Thus, the powder 28 is presented to the component.

Presentation of the ion-plated powder is typically directed by an inert shield gas stream such that the powder is deposited upon the component. Generally this occurs within an inert gas shield and the flow will be funnelled and mechanically entrained to achieve appropriate presentation. The laser melts the powder 28 such that there is micro alloying to create a coating to the component as required.

It will be appreciated from the above that sputter deposition of the trace element upon the base alloy particulates avoids problems with respect to accurate addition of trace elements to an alloy being formed in a crucible. By applying a protective layer over the trace elements the process can occur immediately prior to deposition or alternatively any coated particulate can be produced for stock and stored under acceptable environmental conditions for use when required.

As described above with regard to FIGS. 1 and 2, the base alloy particulate may be simply passively presented upon a conveyor or otherwise such that the ion sputter deposition upon the base alloy particulate is then substantially only upon one side. This may have no significant detrimental effects, but alternatively the base alloy particulate may be presented upon a fluidised bed such that the random motions of the base alloy particulate then leads to trace element deposition more evenly over the particulate surface.

In such circumstances, the powder particulate of the base alloy may be statically presented or randomly presented in a fluid bed agitator.

Where appropriate, it may also be possible to electro statically charge the base alloy particulate powder to further assist attraction through ion sputtering of the trace element.

Fundamentally, the present invention presents the trace element by a sputter deposition upon the particulate, but that trace element does not become alloyed with the base alloy particulate until melted to form the protective coating upon the component. It will be appreciated previously a relatively large block of master alloy for the protective coating alloy is formed requiring a number of melting stages and a very high energy input to achieve as indicated a variable quality product in terms of distribution of the trace element.

Although described with regard to particulate powder, it will be appreciated that the present invention with respect to sputter deposition of the trace element may be performed upon a fine wire such that the wire is again presented to a component in order to form the desired micro alloy composition.

As indicated above typically a particulate form of base metal is utilised upon which the trace elements are deposited. However, where the blade tipping base metal can be formed into a continuous solid form, such as wire or rod, then some technique of sputtering trace metal or elements upon that solid wire etc can be used. With the wire then used to provide the blade tip coating etc. Furthermore, by use of a continuous solid form it will be understood that an entire component may be formed by deposition techniques from that continuous solid wire or rod with the trace element sputtered thereon then distributed throughout the structure. Such deposition techniques include Direct Laser deposition (DLD) and Shaped Metal Deposition (SMD). However, such structures will be expensive as the relatively high cost trace element is distributed throughout the whole structure rather than just upon the surface but may be justified where enhancement of physical properties such as heat resistance and strength, etc are required.

We claim:

1. A method of coating a component comprising:
   a) presenting a base metal particulate to means for ion sputter deposition of at least one element selected from the group of elements consisting of Group IIIB elements, Group IVB elements, and Lanthanides;
   b) sputtering the element upon the base metal particulate;
   c) applying a protective layer over the element to form a coating consumable comprising layers of the base metal particulate, the element and particulate protective layer; and
   d) presenting the coating consumable to the component and melting the coating consumable using a laser beam to form a coating comprising an alloy of the base metal and the element on the component, wherein the protective layer prevents oxidation degradation of the element during melting of the coating consumable and wherein the element is applied to the base metal particulate in an amount so that the element is present in the coating in an amount of 30 to 80 parts per million.

2. A method as claimed in claim 1 in which the base metal particulate is presented in a fluidised bed in order to achieve sputter dispersal of the element evenly about the base metal of the particulate.

3. A method as claimed in claim 1 in which the base metal of the particulate is the same as the major constituent of the component.

4. A method as claimed in claim 1 in which the base metal of the particulate has the same composition as the component.

5. A method of forming a protective coating on a turbine blade comprising:
   a) presenting a base metal particulate to means for ion sputter deposition of at least one element selected from the group of elements consisting of Group IIIB elements, Group IVB elements, and Lanthanides;
   b) sputtering the element upon the base metal particulate;
   c) applying a protective layer over the element to form a coating consumable comprising layers of the base metal particulate, the element and particulate protective layer; and
   d) presenting the coating consumable to the turbine blade and melting the coating consumable using a laser beam to form a protective coating comprising an alloy of the base metal and the element on the turbine blade, wherein the protective layer prevents or oxidation degradation of the element during melting of the coating consumable and wherein the element is applied to the base metal particulate in an amount so that the element is present in the coating in an amount of 30 to 80 parts per million.

6. A method according to claim 5, wherein the base metal particulate is presented in a fluidised bed in order to achieve sputter dispersal of the element evenly about the base metal of the particulate.

7. A method according to claim 5, wherein the base metal of the particulate is the same as a major constituent of the turbine blade.

8. A method according to claim 5, wherein the base metal of the particulate has the same composition as the turbine blade.

* * * * *